(12) United States Patent
Horii et al.

(10) Patent No.: US 8,564,938 B2
(45) Date of Patent: Oct. 22, 2013

(54) ELECTRONIC APPARATUS

(75) Inventors: Yasuyuki Horii, Ome (JP); Koichiro Takeguchi, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 237 days.

(21) Appl. No.: 13/083,383

(22) Filed: Apr. 8, 2011

(65) Prior Publication Data
US 2011/0249383 A1    Oct. 13, 2011

(30) Foreign Application Priority Data
Apr. 12, 2010    (JP) .................................. 2010-091552

(51) Int. Cl.
*H05K 5/00*    (2006.01)
*H05K 7/00*    (2006.01)

(52) U.S. Cl.
USPC ................................... 361/679.01; 361/679.1

(58) Field of Classification Search
USPC .......................................................... 345/173
See application file for complete search history.

(56) References Cited

U.S. PATENT DOCUMENTS

| | | | | |
|---|---|---|---|---|
| 5,546,334 A | * | 8/1996 | Hsieh et al. | 708/141 |
| 5,646,821 A | * | 7/1997 | Sun | 361/679.1 |
| 5,689,400 A | * | 11/1997 | Ohgami et al. | 361/679.27 |
| 5,793,355 A | * | 8/1998 | Youens | 345/157 |
| 6,177,924 B1 | * | 1/2001 | Bae | 345/157 |
| 6,219,038 B1 | * | 4/2001 | Cho | 345/173 |
| 6,281,887 B1 | * | 8/2001 | Wang | 345/173 |
| 6,606,244 B1 | * | 8/2003 | Liu et al. | 361/679.48 |
| 6,859,355 B2 | * | 2/2005 | Chuang et al. | 361/679.1 |
| 7,119,291 B2 | * | 10/2006 | Sun | 200/5 A |
| 7,294,805 B2 | * | 11/2007 | Luo et al. | 200/500 |
| RE40,323 E | * | 5/2008 | Bae | 345/157 |
| 7,486,278 B2 | * | 2/2009 | Sun | 345/173 |

(Continued)

FOREIGN PATENT DOCUMENTS

| JP | U 60-50439 | 4/1985 |
|---|---|---|
| JP | 63-292537 | 11/1988 |

(Continued)

OTHER PUBLICATIONS

Notice of Reason for Rejection mailed by the Japan Patent Office on Nov. 22, 2011, for Japanese Patent Application No. 2011-181359.

(Continued)

*Primary Examiner* — Hoa C Nguyen
*Assistant Examiner* — Xanthia C Cunningham
(74) *Attorney, Agent, or Firm* — Knobbe, Martens, Olson & Bear LLP

(57) ABSTRACT

According to one embodiment, an electronic apparatus includes a casing, a device attachment portion, a pointing device, an attachment member and a button member. The casing includes an outer surface, an inner surface and an opening. The device attachment portion is provided in the casing. The pointing device is attached to the device attachment portion from a side of the inner surface. The attachment member is removably fixed to the casing and covers a part of the pointing device from the side of the inner surface. The button member is attached to the attachment member and includes a base portion, a supporting portion and an operating portion. The base portion is fixed to the attachment member. The supporting portion extends from the base portion. The operating portion at a front end of the supporting portion is fitted in the opening, and exposed to the outside of the casing.

15 Claims, 9 Drawing Sheets

(56) References Cited

U.S. PATENT DOCUMENTS

| | | | |
|---|---|---|---|
| 7,544,904 B2* | 6/2009 | Nakatani et al. | 200/5 A |
| 7,602,604 B2* | 10/2009 | Shiroishi et al. | 361/679.45 |
| 7,729,519 B2 | 6/2010 | Shigenobu et al. | |
| 2001/0009498 A1* | 7/2001 | Oross et al. | 361/681 |
| 2004/0100449 A1* | 5/2004 | Chuang et al. | 345/173 |
| 2005/0180099 A1* | 8/2005 | Lin et al. | 361/683 |
| 2006/0201792 A1* | 9/2006 | Sun | 200/5 A |
| 2007/0144885 A1* | 6/2007 | Nakatani et al. | 200/520 |
| 2008/0030934 A1* | 2/2008 | Hou | 361/680 |
| 2008/0239641 A1 | 10/2008 | Sato et al. | |
| 2009/0009939 A1* | 1/2009 | Nakajima et al. | 361/680 |
| 2009/0304241 A1* | 12/2009 | Shigenobu et al. | 382/124 |

FOREIGN PATENT DOCUMENTS

| | | |
|---|---|---|
| JP | 5-25788 | 2/1993 |
| JP | 6-41036 | 5/1994 |
| JP | 11-168288 | 6/1999 |
| JP | 2002-190679 | 7/2002 |
| JP | 2008-108558 | 5/2008 |
| JP | 2008-250831 | 10/2008 |
| JP | 2009-117377 | 5/2009 |
| JP | 2009-294944 | 12/2009 |

OTHER PUBLICATIONS

Final Office Action mailed by Japan Patent Office on Apr. 10, 2012 in the corresponding Japanese Patent Application No. 2011-181359.

* cited by examiner

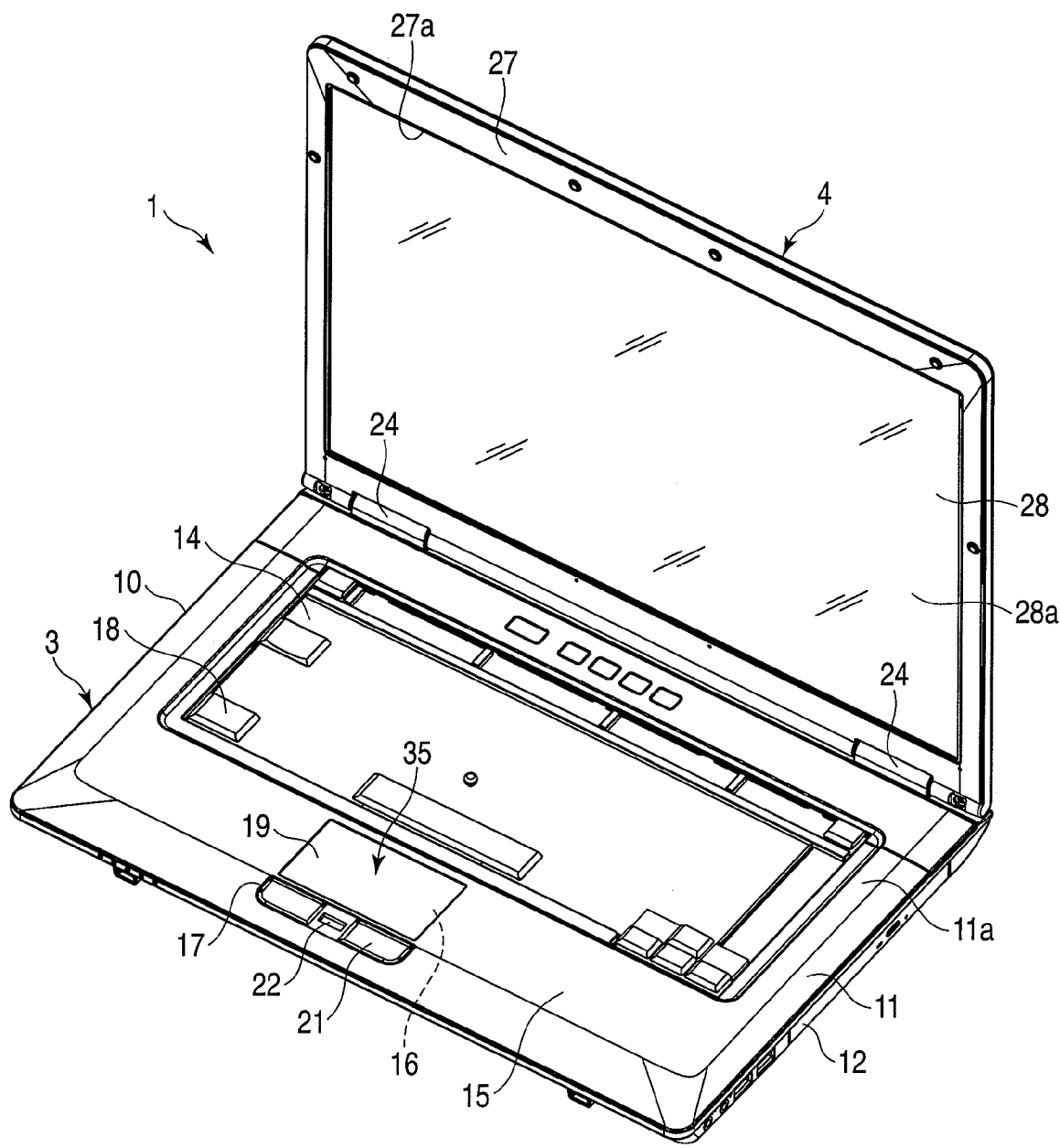
F I G. 1

US 8,564,938 B2

ELECTRONIC APPARATUS

CROSS-REFERENCE TO RELATED APPLICATIONS

This application is based upon and claims the benefit of priority from Japanese Patent Application No. 2010-091552, filed Apr. 12, 2010; the entire contents of which are incorporated herein by reference.

FIELD

Embodiments described herein relate generally to an electronic apparatus.

BACKGROUND

An electronic apparatus, such as a portable computer, may comprise a touch pad as a pointing device. The portable computer is provided with an external input button for clicking operations. The external input button is located near the touch pad.

Generally, the touch pad and the external button are provided on a palm rest which is located in front of the keyboard. The external input button is arranged in front of the touch pad. In other words, the external input button is arranged near a front end of the casing of the portable computer.

The external input button comprises a base portion fixed to the casing, a supporting portion having flexibility and an operating portion which is pressed by a user. The supporting portion connects the base portion and the operating portion. The operating portion is fit in an opening provided in the casing, so that it is exposed to the outside of the casing. The base portion is fixed to the casing by, for example, welding, near the opening.

The electronic apparatus such as a portable computer, which is carried by the user, is required to be compact and thin. However, because of the space to fix the base portion of the external input button, the electronic apparatus may be prevented from being compact.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

FIG. 1 is an exemplary perspective view of a portable computer according to a first embodiment;

DETAILED DESCRIPTION

Figure 2:
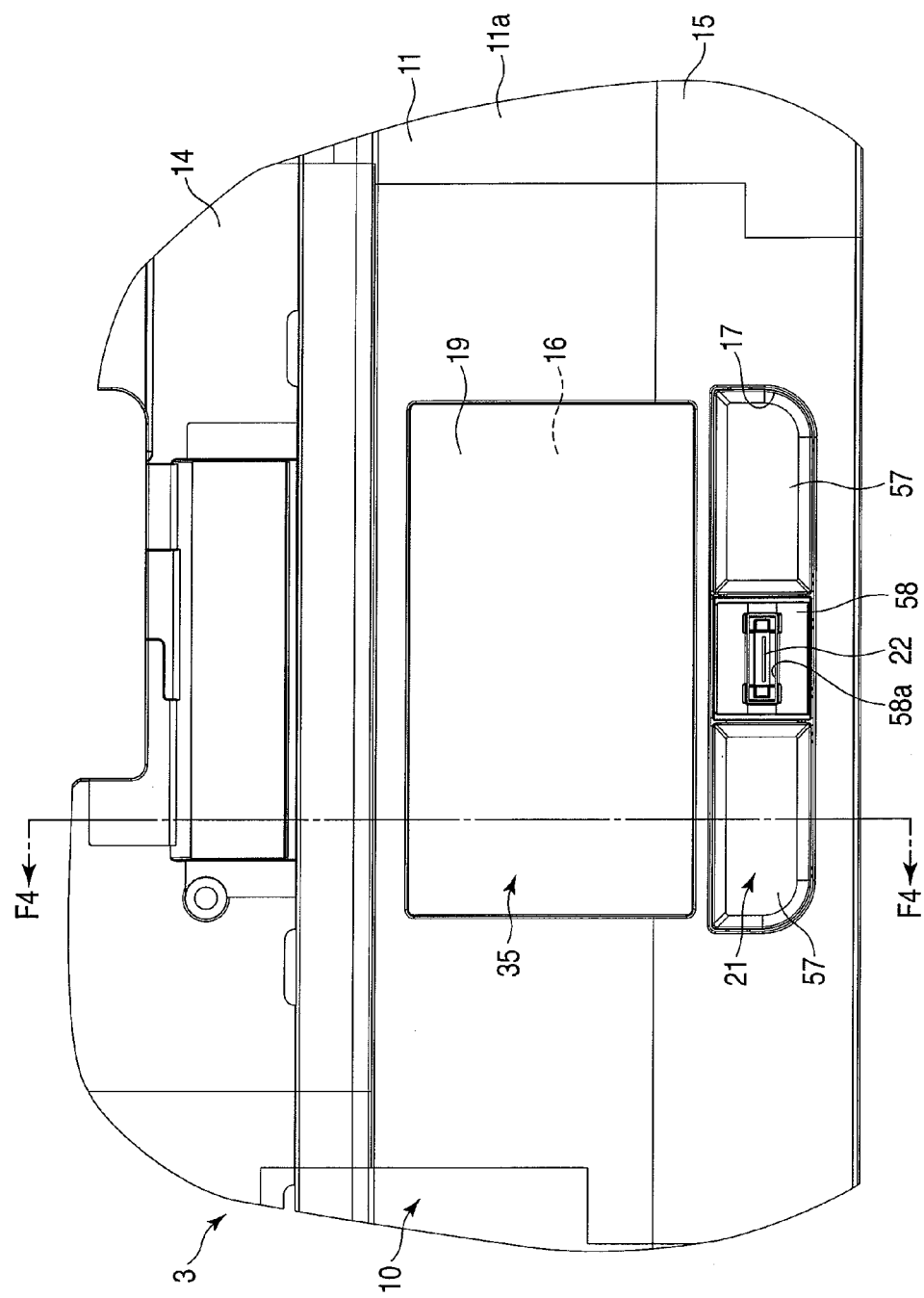
FIG. 2 is an exemplary enlarged plan view of a part of the portable computer of the first embodiment.

Various embodiments will be described hereinafter with reference to the accompanying drawings.

In general, according to one embodiment, an electronic apparatus includes a casing, a device attachment portion, a pointing device, an attachment member and a button member. The casing includes an outer surface exposed to an outside of the casing, an inner surface located in an opposite side from the outer surface and an opening provided across the outer surface and the inner surface. The device attachment portion is provided in proximity with the opening in the casing. The pointing device is attached to the device attachment portion from a side of the inner surface. The attachment member is removably fixed to the casing from the side of the inner surface and covers a part of the pointing device from the side of the inner surface. The button member is attached to the attachment member. The button member includes a base portion, a flexible supporting portion and an operating portion. The base portion is fixed to the attachment member. The flexible supporting portion extends from the base portion toward the opening. The operating portion which is provided at a front end of the flexible supporting portion, is fitted in the opening, and exposed to the outside of the casing.

A first embodiment will be described with reference to FIG. 1 to FIG. 7. This specification defines a near side (or a user side) as the front, a far side from the user as the rear, a left side viewed from the user as the left side, a right side viewed from the user as the right side, an up side viewed from the user as the up side, and a down side viewed from the user as the down side.

FIG. 1 is a perspective view showing a portable computer 1. The portable computer 1 is an example of the electronic apparatus. As shown in FIG. 1, the portable computer 1 comprises a main unit 3 and a display unit 4.

The main unit 3 comprises a flat box-shaped casing 10. The casing 10 comprises an upper cover 11 and a lower cover 12. The upper cover 11 is attached to the lower cover 12 to cover it.

A keyboard attachment portion 14, a palm rest 15, a recess surface 16 and an opening 17 are provided on an outer surface 11a of the upper cover 11. The outer surface 11a is an example of the outer surfaces of the casing and exposed to the outside. A keyboard 18 is supported by the keyboard attachment portion 14. FIG. 1 shows some parts of the keyboard 18.

The palm rest 15 is provided in front of the keyboard attachment portion 14. The recess surface 16 and the opening 17 are provided in proximity to each other in a substantially central portion of the palm rest 15. The recess surface 16 is retracted from the palm rest 15. A sheet 19 is attached to the recess surface 16. The surface of the sheet 19 is smooth.

FIG. 2 is an enlarged plan view of a part near the opening 17 of the portable computer 1. As shown in FIG. 2, a button member 21 and a fingerprint reader 22 are exposed through the opening 17. The button member 21 is used for a clicking operation. The fingerprint reader 22 is, for example, an optical sensor and used for fingerprint authentication.

As shown in FIG. 1, the display unit 4 is connected to a rear end of the main unit 3 via a pair of hinge portions 24. The display unit 4 is rotatable about the hinge portions 24 between an open position and a closed position. In the closed position, the display unit 4 lies over the main unit 3. In the open position, the display unit 4 stands from the rear end of the main unit 3.

The display unit 4 comprises a flat box-shaped display casing 27 and a display module 28. The display module 28 is, for example, a liquid crystal display and contained in the display casing 27.

The display casing 27 comprises a display opening 27a in the front surface thereof. The display opening 27a causes a screen 28a of the display module 28 to expose out of the display unit 4.

Figure 3:
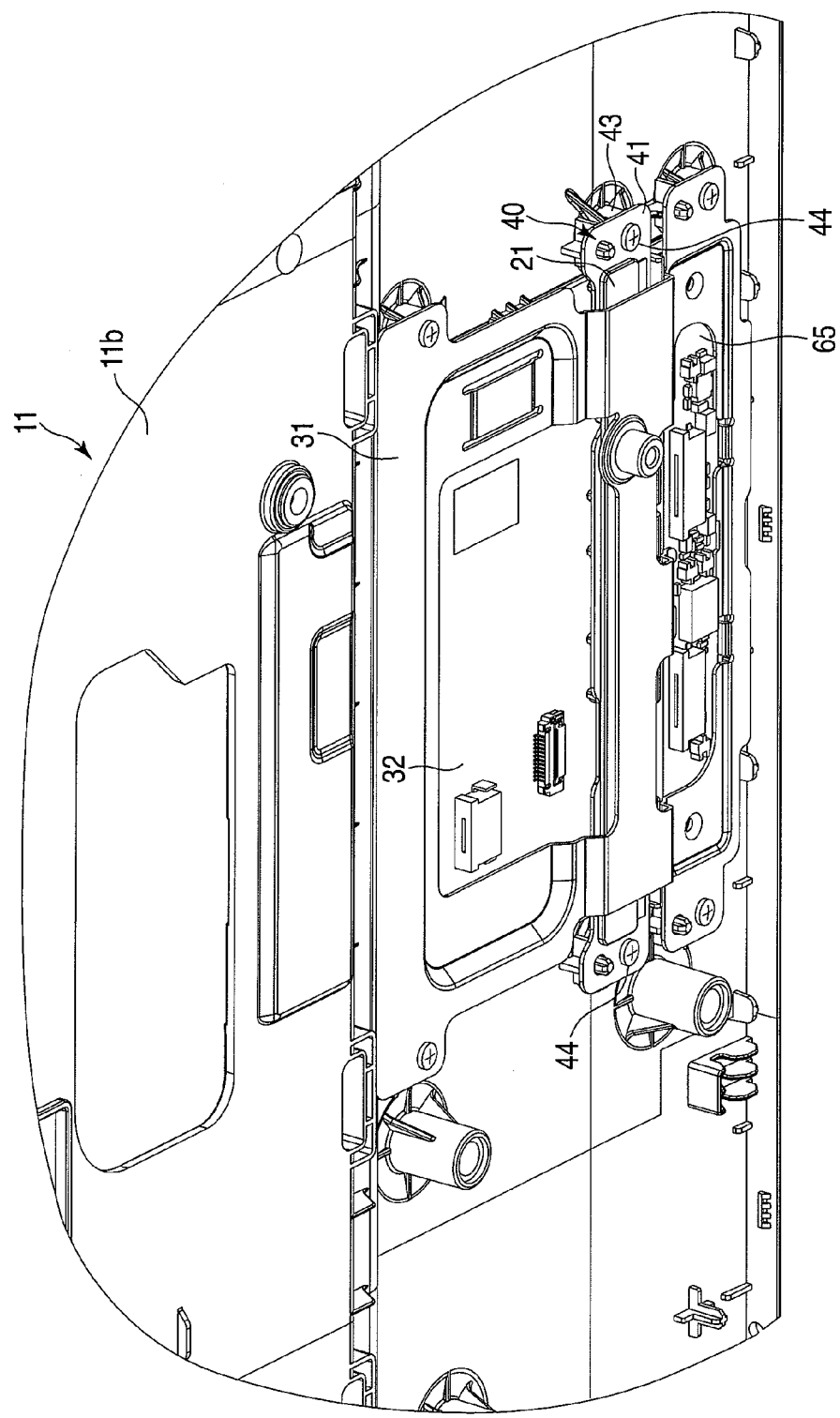
FIG. 3 is an exemplary perspective view showing a part of the portable computer of the first embodiment as viewed from an inner side of the casing.
Figure 4:
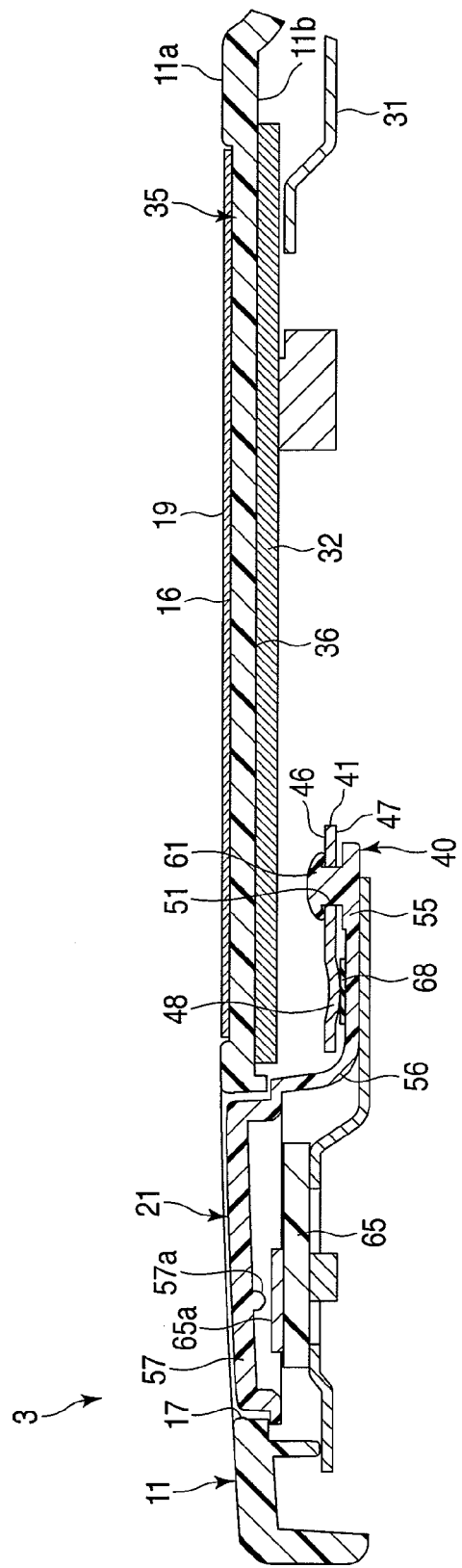
FIG. 4 is an exemplary cross-sectional view of a part of the portable computer of the first embodiment taken along the line F4-F4 in FIG. 2.

FIG. 3 is a perspective view showing a part near the recess surface 16 as viewed from an inner side of the casing 10. FIG. 4 is a cross-sectional view of a part of the main unit 3 taken along the line F4-F4 in FIG. 2. As shown in FIG. 3, a device support member 31 is attached to an inner surface 11b of the upper cover 11.

The inner surface 11b of the upper cover 11 is an example of the inner surfaces of the casing and located on the opposite side from the outer surface 11a. As shown in FIG. 4, the opening 17 is provided across the outer surface 11a and the inner surface 11b of the upper cover 11.

The device support member 31 supports a touch pad device 32. The touch pad device 32 is an example of the pointing device. The touch pad device 32 comprises, for example, an electrostatic sensor, and senses movement of a finger on the sheet 19. The touch pad device 32 is operated by a user's finger which moves on the sheet 19.

Figure 5:
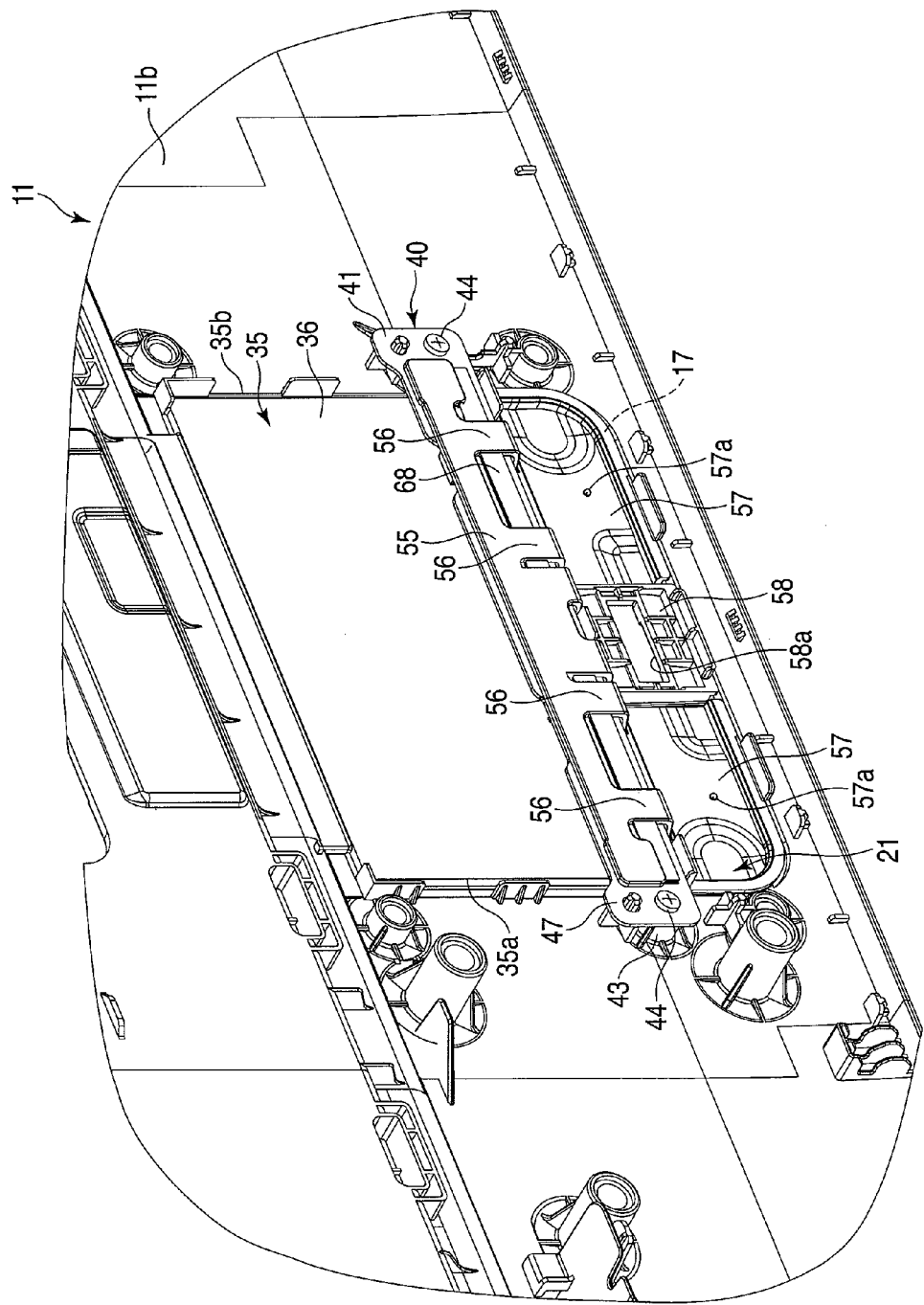
FIG. 5 is an exemplary perspective view of the part shown in FIG. 3, from which a device support member and a touch pad device are excluded.

FIG. 5 is a perspective view of the part shown in FIG. 3, from which the device support member 31 and the touch pad device 32 are excluded. As shown in FIG. 5, the upper cover 11 comprises a device attachment portion 35. The device attachment portion 35 is located in proximity with the opening 17.

The device attachment portion 35 includes a flat adhering surface 36 facing the inner side of the casing 10. The device attachment portion 35, which includes the recess surface 16 and the adhering surface 36, is a part of the upper cover 11.

The touch pad device 32 is attached to the adhering surface 36 of the device attachment portion 35 from the side of the inner surface 11b. In other words, the touch pad device 32 is attached to the attachment portion 35 from the inside of the casing 10. The touch pad device 32 is adhered to the adhering surface 36 by, for example, a double-faced tape.

Figure 6:
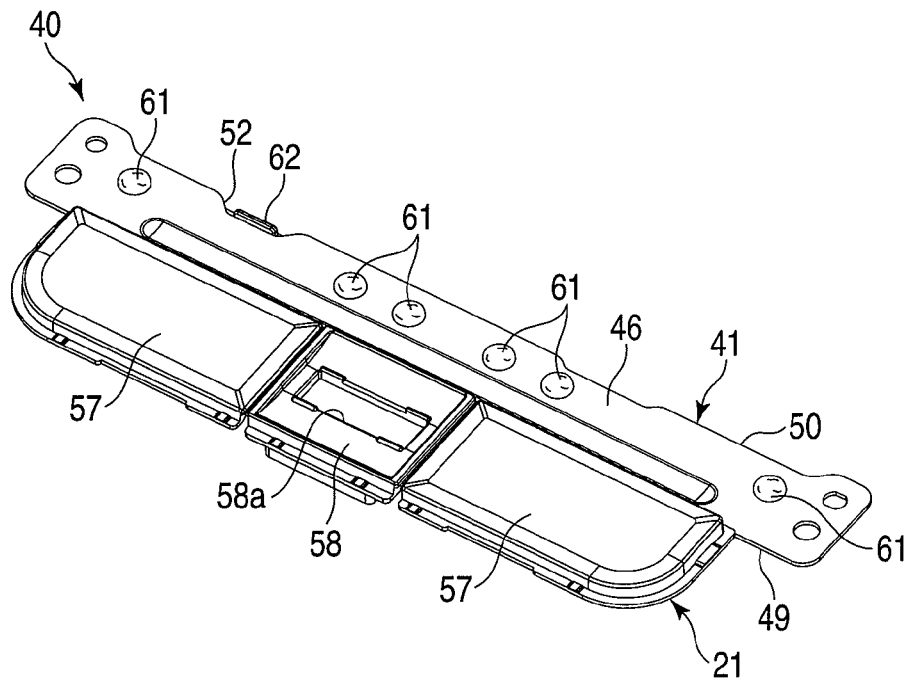
FIG. 6 is an exemplary perspective view of a button unit of the first embodiment.
Figure 7:
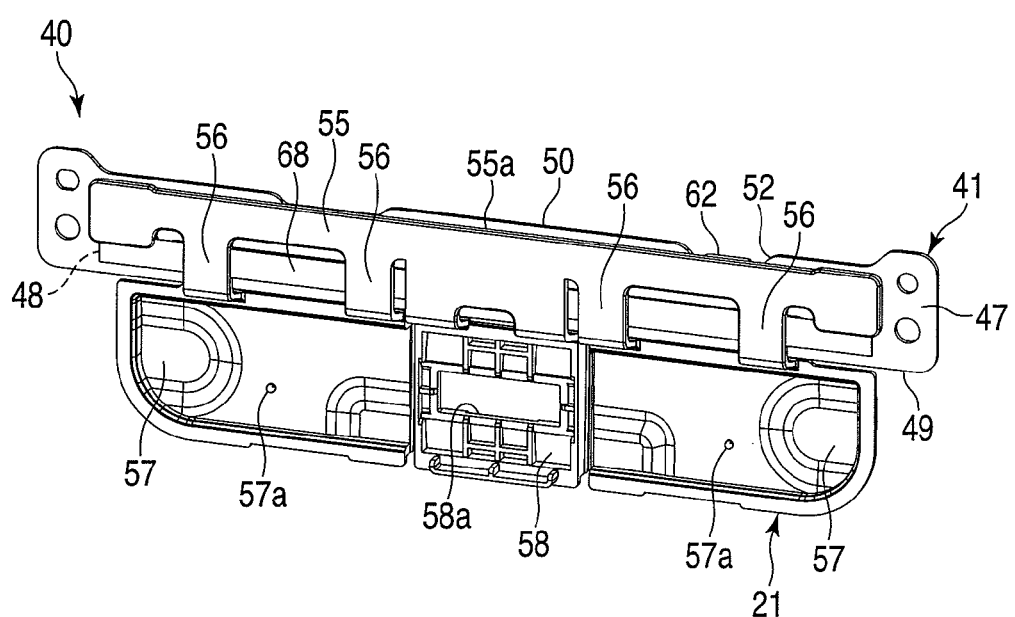
FIG. 7 is an exemplary perspective view of the button unit of the first embodiment as viewed from below.

The upper cover 11 is provided with a button unit 40 including the button member 21. FIG. 6 is a perspective view of the button unit 40. FIG. 7 is a perspective view of the button unit 40 as viewed from below. The button unit 40 comprises the button member 21 and an attachment member 41.

As shown in FIG. 5, the attachment member 41 is removably fixed to the upper cover 11 from the side of the inner surface 11b. A pair of bosses 43 is provided in the inner surface 11b near the device attachment portion 35. The bosses 43 are respectively located on the left and right sides of the device attachment portion 35. The attachment member 41 is screwed to the bosses 43 by, for example a pair of screws 44.

The attachment member 41 is fixed to the upper cover 11, and the attachment member 41 covers a part of the touch pad device 32 from the side of the inner surface 11b, as shown in FIG. 4. In other words, the attachment member 41 covers a part of the device attachment portion 35 and overlies the touch pad device 32, in a state where it is fixed to the upper cover 11.

As shown in FIG. 5, the attachment member 41 extends from one end 35a to the other end 35b of the device attachment portion 35 to cover the part of the device attachment portion 35. When the attachment member 41 is fixed to the upper cover 11, as shown in FIG. 4, the touch pad device 32 is sandwiched between the device attachment portion 35 and the attachment member 41.

The attachment member 41 is a plate made of metal material. The attachment member 41 comprises a first surface 46, a second surface 47 and a reinforcing portion 48. The first surface 46 faces the touch pad device 32. The second surface 47 is located on the opposite side from the first surface 46.

Further, as shown in FIG. 6, the attachment member 41 comprises a first edge 49, a second edge 50, a plurality of insertion holes 51 (shown in FIG. 4) and a recess 52. The recess 52 is an example of the first attachment-error preventing portion. The second edge 50 is located on the opposite side from the first edge 49.

The reinforcing portion 48 protrudes from the second surface 47. The reinforcing portion 48 extends in a direction, in which the attachment member 41 extends, and along the first edge 49 of the attachment member 41. The insertion holes 51 are arranged along the second edge 50 of the attachment member 41.

The recess 52 is recessed from the second edge 50 toward the inner side of the attachment member 41. The recess 52 is located in a position deviated from the center of the second edge 50.

As shown in FIG. 7, the button member 21 is attached to the attachment member 41. The button member 21 comprises a base portion 55, a plurality of supporting portions 56, a pair of operating portions 57 and a sensor cover 58. Further, as shown in FIG. 6, the button member 21 comprises a plurality of projections 61 and a rib 62. The rib 62 is an example of the second attachment-error preventing portion.

As shown in FIG. 4, the base portion 55 is fixed to the attachment member 41 in a position which overlaps the touch pad device 32. The base portion 55 is arranged along the second edge 50 of the attachment portion 41. The projections 61, which project from the base portion 55, are inserted in the insertion holes 51 of the attachment member 41. The projections 61 inserted in the insertion holes 51 are melted, so that the base portion 55 is fixed to the attachment member 41.

The supporting portions 56 extend from the base portion 55 toward the opening 17. As shown in FIG. 7, the supporting portions 56 overlap a part of the attachment member 41. The supporting portions 56 have flexibility and are elastically deformed by external force.

The pair of operating portions 57 is provided at a front end of the supporting portions 56. As shown in FIG. 2, the operating portions 57 and the sensor cover 58 are fit in the opening 17 and exposed to the outside of the casing 10. When the operating portions 57 are pressed, the supporting portions 56 are elastically deformed, resulting in displacement of the operating portions 57.

A switch board 65 is attached to the device support member 31 to face the operating portion 57, as shown in FIG. 4. When the pressed operating portion 57 is displaced, a projection 57a of the operating portion 57 operates a switch 65a mounted on the switch board 65.

As shown in FIG. 7, the sensor cover 58 extends from the base portion 55 and is interposed between the operating portions 57. The sensor cover 58 comprises a slit 58a. The sensor cover 58 covers the fingerprint reader 22, which is exposed to the outside through the slit 58a.

The rib 62 is provided at the edge 55a of the base portion 55. The edge 55a is located on the opposite side from the supporting portions 56. The rib 62 is located at a position corresponding to the recess 52 of the attachment member 41. The rib 62 projects from the base portion 55 in the same direction as the projections 61.

The rib 62 engages with the recess 52 of the attachment member 41, if the projections 61 are inserted in the insertion holes 51 of the attachment member 41 from the side of the second surface 47 before the projections 61 are melted. If the projections 61 are inserted in the insertion holes 51 from the side of the first surface 46, the rib 62 hits the attachment member 41. In other words, the recess 52 of the attachment member 41 engages with the rib 62 only when the projections 61 are inserted in the insertion holes 51 of the attachment member 41 from the side of the second surface 47.

The button member 21 is formed so as to be attached to the attachment member 41 from the side of the second surface 47. If the button member 21 is attached to the attachment member 41 from the side of the first surface 46, the rib 62 hits the attachment member 41. Therefore, attachment error of the button member 21 is prevented.

As shown in FIG. 7, a shock absorbing member 68 is fixed to the attachment member 41. The shock absorbing member 68 is adhered to the reinforcing portion 48 of the attachment member 41 by, for example, a double-faced tape. As the shock absorbing member 68, for example, synthetic rubber, unwoven cloth or sponge may be used.

The shock absorbing member 68 is sandwiched between the attachment member 41 and the supporting portion 56. If the operating portion 57 is pressed and deformed and then the external force exerted on the operating portion 57 is released, the supporting portion 56 which has been elastically deformed returns to the original position. At this time, the shock absorbing member 68 receives the supporting portion 56.

With the portable computer 1 of the above configuration, the attachment member 41 is fixed to the upper cover 11 while the attachment member 41 covers a part of the touch pad device 32 and a part of the device attachment portion 35. The base portion 55 of the button member 21 is fixed to the attachment member 41 that overlaps the touch pad device 32. As a result, a space to fix the base portion 55 of the button member 21 to the casing 10 is unnecessary near the opening 17. Therefore, the portable computer 1 can be compact.

The attachment member 41 is made of metal. Therefore, the attachment member 41 that overlies the touch pad device 32 can be thin, so that the portable computer 1 can be thin. The material of the attachment member 41 is not limited to metal, but may be any other material that is sufficiently rigid.

The attachment member 41 is removably fixed to the upper cover 11. Therefore, the order of attaching the attachment member 41 to the upper cover 11 can be flexibly set. For example, even after the attachment member 41 is disposed to cover the device attachment portion 35, the touch pad device 32 can be attached to the adhering surface 36 of the device attachment portion 35. Further, if the button unit 40 is broken, the attachment member 41 can be removed from the upper cover 11 to replace the button unit 40.

A second embodiment will now be described with reference to FIG. 8. The components having the same functions as those of the portable computer 1 of the first embodiment are identified by the same reference numerals as those used for the first embodiment, and the descriptions thereof will be omitted.

Figure 8:
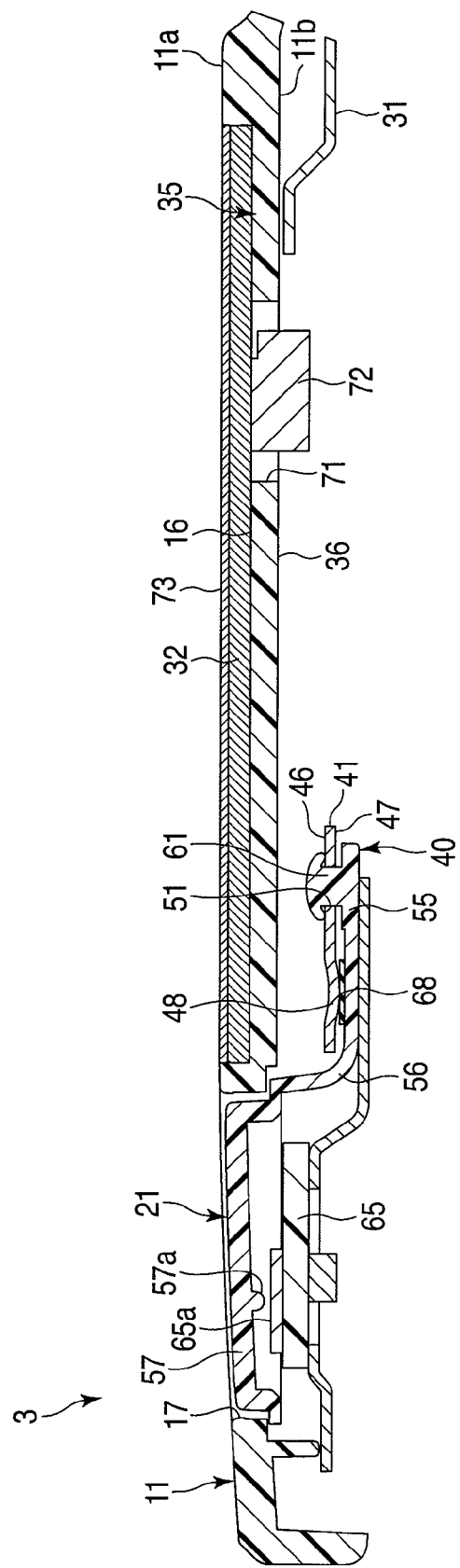
FIG. 8 is an exemplary cross-sectional view of a part of a portable computer according to a second embodiment.

FIG. 8 is a cross-sectional view of a part of a portable computer 1 according to a second embodiment. As shown in FIG. 8, a device attachment portion 35 comprises a part insertion hole 71 across a recess surface 16 and an adhering surface 36.

A touch pad device 32 is attached to a recess surface 16 of the device attachment portion 35 from a side of an outer surface 11a. The touch pad device 32 is adhered to the recess surface 16 by, for example, a double-faced tape.

The touch pad device 32 comprises a plurality of electronic parts 72. The electronic parts 72 may be a variety of parts, for example, connectors. The electronic parts 72 are inserted through the part insertion hole 71 which is open in the recess surface 16.

A sheet 73 is adhered to the touch pad device 32 from the side of the outer surface 11a. The sheet 73 covers the touch pad device 32 and has a smooth surface. The touch pad device 32 senses movement of a finger on the sheet 73.

With the portable computer 1 of the above configuration, the touch pad device 32 is attached to the device attachment portion 35 from the side of the outer surface 11a. Even if the touch pad 32 is attached to the recess surface 16 that is exposed to the outside of the casing 10 as described above, the same attachment member 41 as the first embodiment can be used.

A third embodiment will now be described with reference to FIG. 9 and FIG. 10. The components having the same functions as those of the portable computer 1 of the first embodiment are identified by the same reference numerals as those used for the first embodiment, and the descriptions thereof will be omitted.

Figure 9:
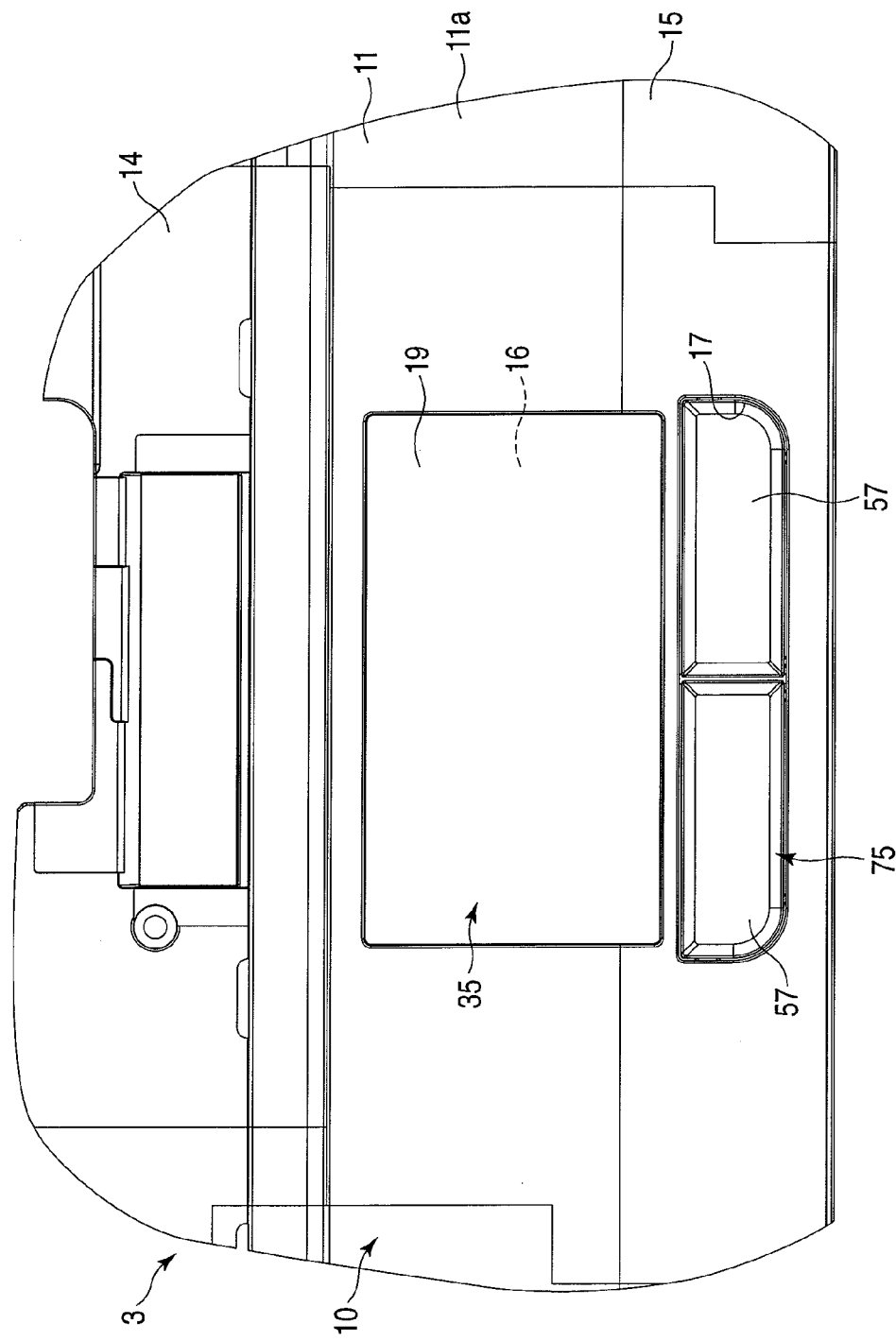
FIG. 9 is an exemplary enlarged plan view of a part of the portable computer according to a third embodiment.

FIG. 9 is an enlarged plan view of a part near a device attachment portion 35 of the portable computer 1 according to the third embodiment. As shown in FIG. 9, a button member 75 is exposed through an opening 17.

Figure 10:
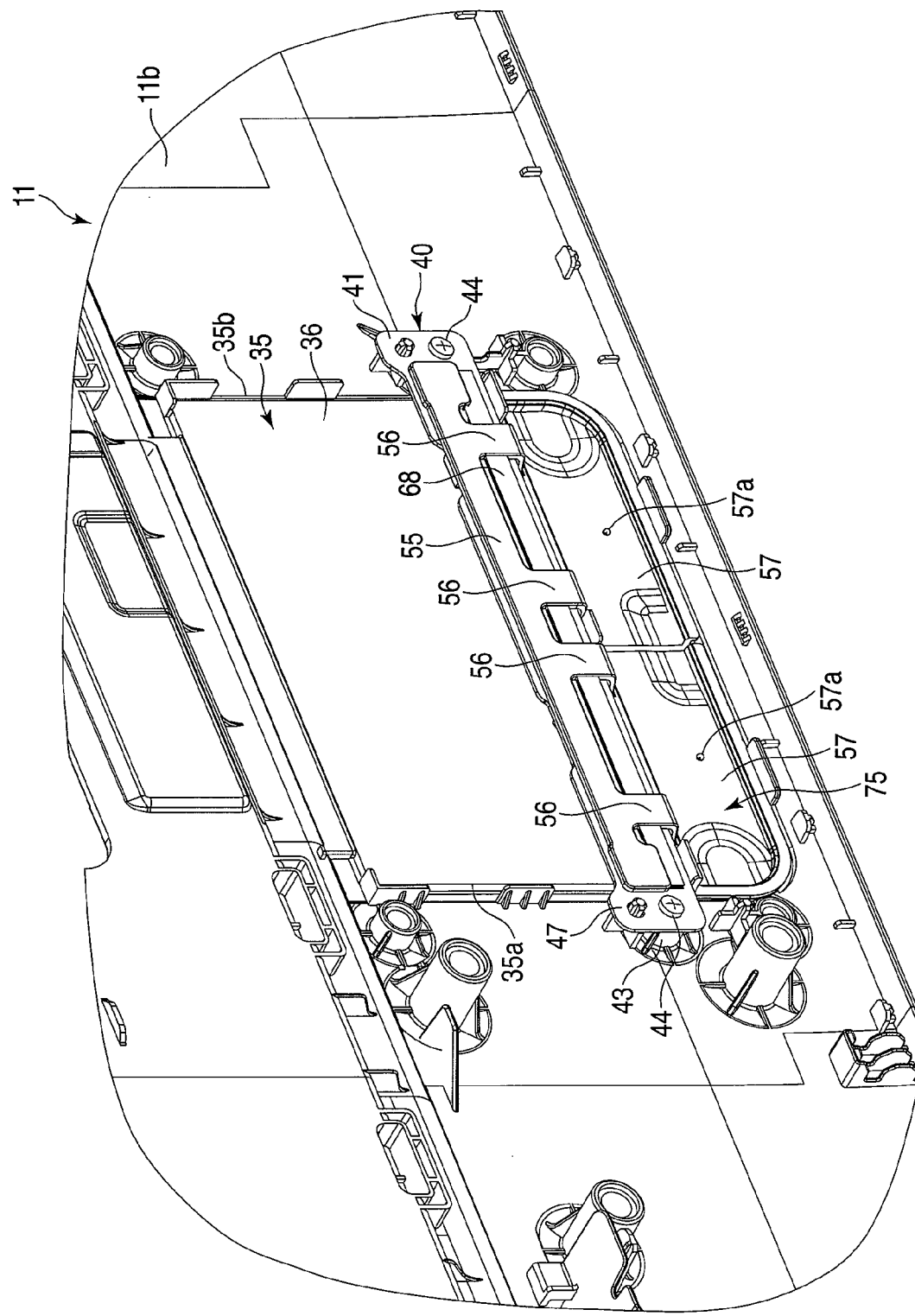
FIG. 10 is an exemplary perspective view showing a part of the portable computer of the third embodiment as viewed from an inner side of the casing.

FIG. 10 is a perspective view showing a part near the device attachment portion 35 as viewed from an inner side of a casing 10. As shown in FIG. 10, the button member 75 comprises a base portion 55, a plurality of supporting portions 56, a pair of operating portions 57, a plurality of projections 61 and a rib 62. The button member 75 is different from the button member 21 of the first embodiment in that it comprises no sensor cover 58.

Even the button member 75 of the above configuration can be attached to the attachment member 41 as well as the button member 21 of the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the pointing device is not limited to the touch pad. For example, a touch panel may be used as the pointing device. Further, the attachment member and the supporting portion may be formed integrally as one unit.

What is claimed is:

1. An electronic apparatus comprising:
   a casing comprising an outer surface exposed to an outside of the casing, an inner surface located in an opposite side from the outer surface and an opening provided across the outer surface and the inner surface;
   a device attachment portion provided in proximity with the opening in the casing;
   a pointing device attached to the device attachment portion from a side of the inner surface;
   an attachment member removably fixed to the casing from the side of the inner surface and covering a part of the pointing device from the side of the inner surface; and a button member attached to the attachment member,
the button member comprising:
a base portion fixed to the attachment member;
a flexible supporting portion extending from the base portion toward the opening; and
an operating portion which is provided at a front end of the flexible supporting portion, fitted in the opening, and accordingly exposed to the outside of the casing.

2. The electronic apparatus of claim 1, wherein the base portion is fixed to the attachment member at a position which overlaps the pointing device.

3. The electronic apparatus of claim 2, wherein the attachment member is made of metal.

4. The electronic apparatus of claim 2, further comprising a shock absorbing member fixed to the attachment member, wherein:
the flexible supporting portion of the button member overlaps a part of the attachment member, and the flexible supporting portion and the attachment member lie on either side of the shock absorbing member.

5. The electronic apparatus of claim 2, wherein
the attachment member comprises a first surface which faces the pointing device, a second surface located on a side opposite from the first surface and a reinforcing portion protruding from the second surface, extends from one end to another end of the device attachment portion to cover a part of the device attachment portion; and
the reinforcing portion extends in a direction in which the attachment member extends.

6. The electronic apparatus of claim 5, wherein:
the attachment member comprises an insertion hole and a first attachment-error preventing portion;
the base portion of the button member comprises a projection to be inserted into the insertion hole and a second attachment-error preventing portion; and
the first attachment-error preventing portion and the second attachment-error preventing portion engage with each other only when the projection is inserted in the insertion hole from a side of the second surface.

7. The electronic apparatus of claim 6, wherein
the second attachment-error preventing portion is a rib provided at an edge of the base portion of the button member.

8. The electronic apparatus of claim 6, wherein
the first attachment-error preventing portion is a recess, and
the second attachment-error preventing portion is a rib located at a position corresponding to the recess of the attachment member.

9. The electronic apparatus of claim 6, wherein
the second attachment-error preventing portion is a rib,
the rib projects from the base portion in the same direction as the projection.

10. The electronic apparatus of claim 1, further comprising:
a device support member attached to the inner surface of the casing and supporting the pointing device;
a switch board attached to the device support member.

11. The electronic apparatus of claim 1, wherein the operating portion is supported by the flexible supporting portion at one end.

12. An electronic apparatus comprising:
a casing comprising an outer surface exposed to an outside of the casing, an inner surface located in an opposite side from the outer surface and an opening provided across the outer surface and the inner surface;
a device attachment portion, which is provided in proximity with the opening in the casing and to which a pointing device is attached;
an attachment member removably fixed to the casing from the side of the inner surface and covering a part of the device attachment portion from the side of the inner surface;
a flexible supporting portion extending from the attachment member toward the opening; and
an operating portion which is provided at a front end of the flexible supporting portion, fitted in the opening, and accordingly exposed to the outside of the casing.

13. The electronic apparatus of claim 12, further comprising a button member including the flexible supporting portion and the operating portion, wherein
the button member comprises a base portion fixed to the attachment member; and
the flexible supporting portion extends from the base portion toward the opening.

14. The electronic apparatus of claim 12, wherein the pointing device is attached to the device attachment portion from a side of the inner surface and sandwiched between the device attachment portion and the attachment member.

15. The electronic apparatus of claim 12, wherein the pointing device is attached to the device attachment portion from a side of the outer surface.

* * * * *